(12) United States Patent
Nagai et al.

(10) Patent No.: US 6,390,281 B1
(45) Date of Patent: May 21, 2002

(54) METHOD AND DEVICE FOR SUPPLYING ELECTRONIC PARTS

(75) Inventors: Yoshiyuki Nagai, Toyonaka; Ryoji Inutsuka, Osaka; Koichi Yabuki, Nara; Kunio Oe, Hirakata; Hideo Sakon, Takatsuki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/367,577

(22) PCT Filed: Feb. 16, 1998

(86) PCT No.: PCT/JP98/00645

§ 371 Date: Dec. 2, 1999

§ 102(e) Date: Dec. 2, 1999

(87) PCT Pub. No.: WO98/37745

PCT Pub. Date: Aug. 27, 1998

(30) Foreign Application Priority Data

Feb. 21, 1997 (JP) .............................. 9-037677

(51) Int. Cl.⁷ ................................................ H05K 3/30
(52) U.S. Cl. ........................ 198/572; 198/364; 29/740; 29/759; 29/771; 29/785
(58) Field of Search ................. 198/572, 364; 29/771, 785, 740, 759

(56) References Cited

U.S. PATENT DOCUMENTS

| 4,999,909 A | * 3/1991 | Egushi et al. .................. 29/740 |
| 5,365,452 A | * 11/1994 | Imafuku et al. ............... 29/740 |
| 5,442,566 A | * 8/1995 | Imafuku et al. ............... 29/759 |
| 5,979,045 A | * 11/1999 | Nishimori et al. ............. 29/740 |

FOREIGN PATENT DOCUMENTS

| JP | 3-221334 | 9/1991 |
| JP | 3-257900 | 11/1991 |

* cited by examiner

Primary Examiner—Christopher P. Ellis
Assistant Examiner—Mark A. Deuble
(74) Attorney, Agent, or Firm—Jordan and Hamburg LLP

(57) ABSTRACT

A method and device for feeding an electronic component are provided by which extensive shutdown of the electronic component mounting device due to lack of components is prevented, thereby enhancing the operation rate. The device has a feeder section designating unit (32) for designating a desired one of feeder sections (22), and a feeder section controller (31) for forcibly moving the feeder section which is currently feeding electronic components to a retracted position when the other feeder section has been designated by the feeder section designating unit (32) and for moving the designated feeder section which has been in a standby state to a predetermined component feeding position, by which a long-time pause of the electronic component mounting device caused by exhaustion of components is prevented and the operation rate is enhanced.

14 Claims, 6 Drawing Sheets

METHOD AND DEVICE FOR SUPPLYING ELECTRONIC PARTS

BACKGROUND

The present invention relates to a method and device or feeding an electronic component to an electronic component mounting device which picks up the electronic component with a suction nozzle and mounts it at a specific position on a circuit substrate.

In recent years, with the propagation of leadless electronic components (chip components), their configuration and size have been diversified, so that there has been much demand to obtain an even more accelerated operation and high reliability in an electronic component mounting device for mounting components onto a circuit substrate, so as to construct an electronic circuit by combining the variety of electronic components. It is thus necessary to enhance the efficiency in a component mounting operation under these circumstances, and it is thought to be effective to prevent decrease in the operation rate due to exhaustion of the components to be mounted. Specifically, it may be constructed such that the feeder section for supplying electronic components is divided in sections, on each of which is loaded electronic components of the same kind, and if one type of electronic components is exhausted during a component feeding operation, the electronic component of that type is fed from other feeder sections.

FIG. 6 is a perspective view showing the overall construction of a conventional electronic component mounting device based on the above idea. In the example shown here, the feeder section is divided into two parts for simplifying the explanation. In FIG. 6, both feeder sections 1, 2 are supported on an identical rail (not shown) such as to be movable along a direction Z shown in the figure. When the feeder section 1 or 2 loaded with electronic components is moved to a pick-up position, a suction nozzle unit 7 attached on the circumference of a rotary table 6 is lowered to pick up the electronic component. The suction nozzle unit 7, while holding the electronic component, goes upwards and moves along a circular path at a prescribed angle by means of the rotary table 6. Then, the suction nozzle unit 7 descends again for mounting the electronic component at a predetermined position on the circuit substrate 9 loaded on an X-Y table 8.

Here, the feeder section 1 or 2 moves as described below. As shown in FIG. 7(a), the feeder sections 1 and 2 respectively comprise a plurality of component supply units arranged in parallel. Now it is assumed that each of the component supply units of both feeder sections 1, 2 is loaded with all types of electronic components which need to be mounted, and at the moment components are being fed from a supply unit 3 of the feeder section 1. The other feeder section 2 is not in use, and such state will be hereinafter mentioned as being "on standby". After a while, at least one type of electronic components in the feeder section 1 is used up, upon which the feeder section 2 starts feeding electronic components as shown in FIG. 7(b). The reference numeral 4 indicates a component supply unit which has run out of the electronic components. This state of feeder section 1 will be called a "component exhausted state". While electronic components are being fed from the feeder section 2, the component supply unit 4 which has run out of the components is replenished with the components and is made to be a supply unit 5 loaded with components as shown in FIG. 7(c), so that the feeder section 1 can be again in the standby state.

With the above described conventional construction, under the state shown in FIG. 7(c), the feeder section 2 needs to consume all of the components in order for the feeder section 1 to feed the electronic components again. Here, it is assumed that electronic components of one kind loaded on the feeder section 1 are left only in a small amount.

Referring to FIG. 8, at first the feeder section 1 feeds the electronic components while the other feeder section 2 is on standby. When the feeder section 1 runs out of one type of electronic components, the feeder section 2 starts component feeding. Meanwhile, the feeder section 1 is loaded with electronic components so as to be on standby. Here, electronic components which are replenished are only those which have been used up just before, and the components which still remain even in a small amount are normally not replenished. Successively, the feeder section 2 runs out of electronic components, and the feeder section 1 starts component feeding. Meanwhile, the feeder section 2 starts to be loaded with electronic components, however, the feeder section 1 soon runs out of the components, since some types of electronic components are left in a small amount, and if the loading of electronic components to the feeder section 2 has not yet been completed by this time, both of the feeder sections 1, 2 will soon run out of electronic components, causing the electronic component mounting device to come to a halt. This is one of the factors obstructing enhancement in the operation rate of the electronic component mounting device.

The present invention has been devised in view of the above described circumstance, its main purpose being to provide a method and device for feeding an electronic component with which shutdown of the device caused by shortage of components is prevented, whereby it is possible to enhance the operation rate.

SUMMARY OF THE INVENTION

To accomplish the above object, a first feature of the present invention is a method of feeding an electronic component wherein if one of a plurality of feeder sections, which are respectively loaded with electronic components of identical types, runs out of at least one type of electronic components during a component feeding operation, the other feeder section which has been in a standby state starts feeding the electronic components of the type which has been used up: In the method, when one of the feeder sections which are in a standby state is designated, the feeder section which is currently feeding electronic components is forcibly moved aside to a retracted position, and the designated feeder section is moved to a predetermined component feeding position.

With such construction, if one type of electronic components in the feeder section which is on standby is left only in a small amount, this feeder section is designated and moved to the component feeding position, by which components are supplied from this designated feeder section, and this feeder section is forcibly made to be in the component exhausted state, after which it is replenished with components and made to be in a standby state. It is thus possible to prevent a long-time pause of the electronic component mounting device due to shortage of components caused by exhaustion of components at several feeder sections at the same time, since the electronic components are kept from being left in a small amount on the feeder section. Accordingly, the operation rate of the electronic component mounting device can be enhanced.

A second feature of the present invention is a device for feeding an electronic component wherein if one of a plurality of feeder sections, which are respectively loaded with electronic components of identical types, runs out of at least one type of electronic components during a component feeding operation, the other feeder section which has been in a standby state starts feeding the electronic components of the type which has been used up. In this embodiment, the device includes first feeder section designating means for designating a desired one of the feeder sections which are in a standby state; and first feeder section controlling means for forcibly moving the feeder section which is currently feeding electronic components to a retracted position when another feeder section has been designated by the feeder section designating means, and for moving the designated feeder section which has been in a standby state to a predetermined component feeding position.

With the above construction, the same functions and effects as those of the first feature of the invention can be achieved.

A third feature of the present invention is a method of feeding an electronic component wherein if one of a plurality of feeder sections, which are respectively loaded with electronic components of identical types, runs out of at least one type of electronic components during a component feeding operation, the other feeder section which has been in a standby state starts feeding the electronic components of the type which has been used up. In the method, the number of remaining electronic components in each of the feeder sections which are in a standby state is counted, and if there are any feeder section of which counted number of component is fewer than a predetermined value, this feeder section is designated, whereupon the feeder section which is currently feeding electronic components is forcibly moved aside to a retracted position, and the designated feeder section is moved to a predetermined component feeding position.

With such construction, if one type of electronic components on the feeder section on standby is left only in a small amount, this feeder section is designated on the basis of comparison between the counted value of remainder number of components and a preliminarily determined value, and this designated feeder section is moved to the component feeding position, where components are fed from this feeder section, so that this feeder section is forcibly made to be in the component exhausted state, after which the feeder section is replenished with components so as to be in the standby state. It is thus possible to prevent a long-time pause of the electronic component mounting device due to shortage of components caused by exhaustion of components at several feeder sections at the same time, since the electronic components are kept from being left in a small amount on the feeder section. Accordingly, the operation rate of the electronic component mounting device can be enhanced.

A fourth feature of the present invention is a device for feeding an electronic component wherein if one of a plurality of feeder sections, which are respectively loaded with electronic components of identical types, runs out of at least one type of electronic components during a component feeding operation, the other feeder section which has been in a standby state starts feeding the electronic components of the type which has been used up. In this embodiment, the device includes second feeder section designating means for counting a number of remaining electronic components in each of the feeder sections which are in a standby state, and for designating any feeder section which has a fewer number of electronic components than a preliminarily determined value; and second feeder section controlling means for forcibly moving the feeder section which is currently feeding electronic components to a retracted position when another feeder section has been designated by the second feeder section designating means, and for moving the designated feeder section which has been in a standby state to a predetermined component feeding position.

With such construction, the same functions and effects as those of the above described third feature of the invention can be achieved.

DETAILED DESCRIPTION

Several embodiments of the present invention will be hereinafter explained with reference to the attached drawings. The embodiments are shown through FIG. 1 to FIG. 5 which illustrate such electronic component mounting device as shown in FIG. 6. A component feeding device which is applicable to this electronic component mounting device will be explained below. The description of the electronic component mounting device itself will be omitted since it has been already described above.

Figure 1:
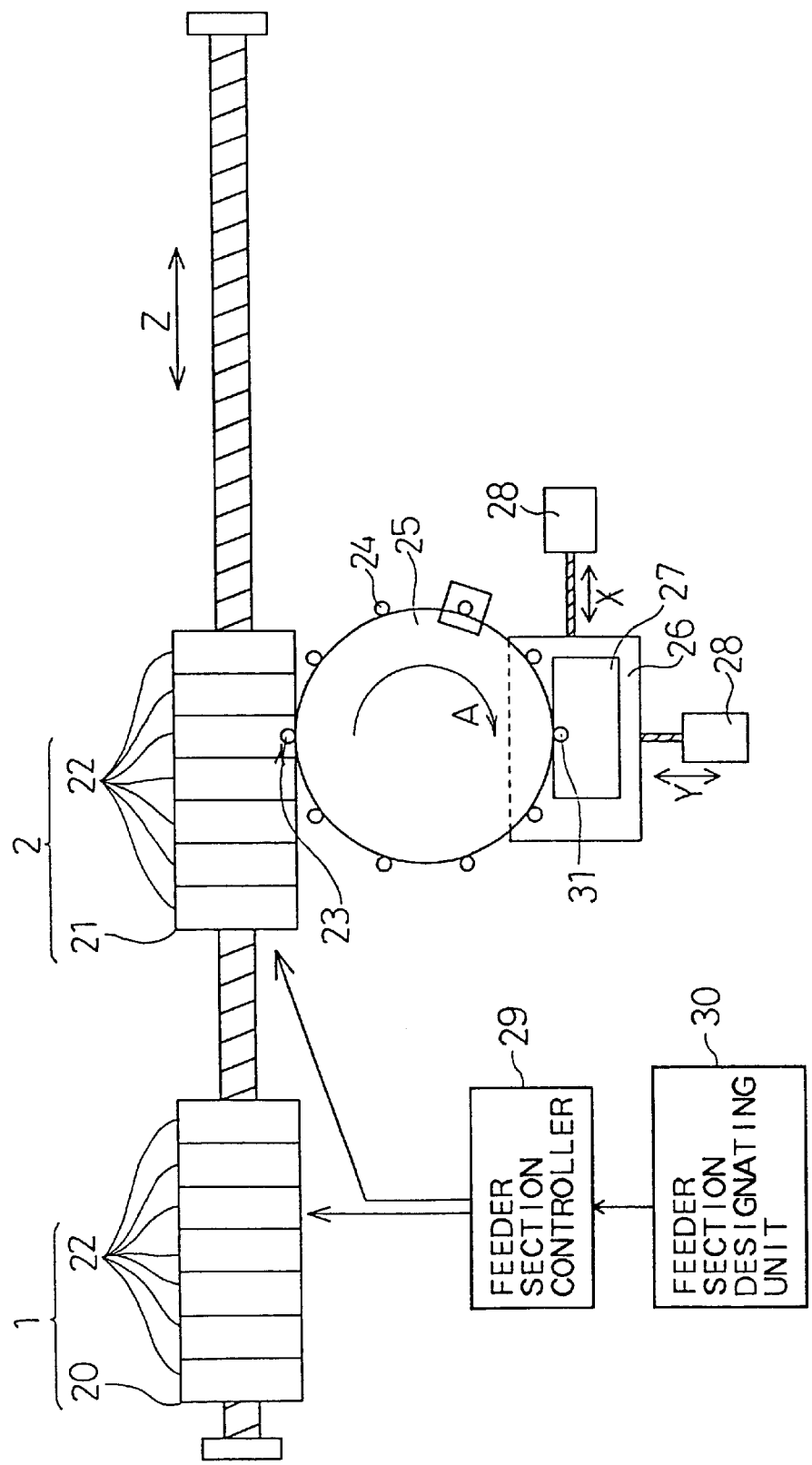
FIG. 1 is a typical plan view of an electronic component feeding device according to a first embodiment of the present invention.

The component feeding device of a first embodiment as a pair of component feeder sections 1, 2, as shown in FIG. 1, which are basically constructed such that moving tables 20, 21 on which a plurality of component supply units 22 are disposed in parallel are movable along a direction denoted at Z in the figure by a driving means (not shown) so that a given component supply unit 22 can be positioned at a specific component feeding position 23. The plurality of component supply units 22 which feed in succession a plurality of electronic components to a component take-out position or the component feeding position 23 are arranged in parallel on the moving table 20, 21, and these moving tables 20, 21 are movable in a direction parallel the component supply units. On each of the moving tables 20, 21, the same combination of the component supply units are disposed, on which identical types of electronic components are arranged in the identical order.

Suction nozzles 24 are arranged at regular intervals around a rotary table 25 which is capable of turning at a specific angle in a direction indicated by the arrow A in the figure, so that the nozzles are moved upwards and downwards at a predetermined position for performing electronic component feeding and mounting operations. An X-Y table 26 is provided for placing a circuit substrate 27 thereon which is transferred by a transfer means (not shown), and is movable in directions shown by the arrows X and Y in the figure by a driving means 28 such as an AC servo motor or the like, so that any given portion of the circuit substrate 27 can be positioned as a component mounting position.

A feeder section controller (first feeder section controlling means) 29 effects positioning control of the moving tables 20, 21 so as to position a component supply unit of the selected feeder section to the component feeding position 23. When the selected feeder section runs out of the components, it is retracted, while the other feeder section on standby is selected and positioned to the component feeding position 23 for further feeding components. Also, if one of the feeder section has been designated by a feeder section designating unit (first feeder section designating means) 30, the designated feeder section is selected and its component supply unit is positioned to the component feeding position 23 for component feeding. The feeder section controller 29 may be, for example, exemplified by an executing program constructed in a computer, and the feeder section designating unit 30 may be, for example, a selecting switch.

Actions with the above described construction will be described below.

Figure 2:
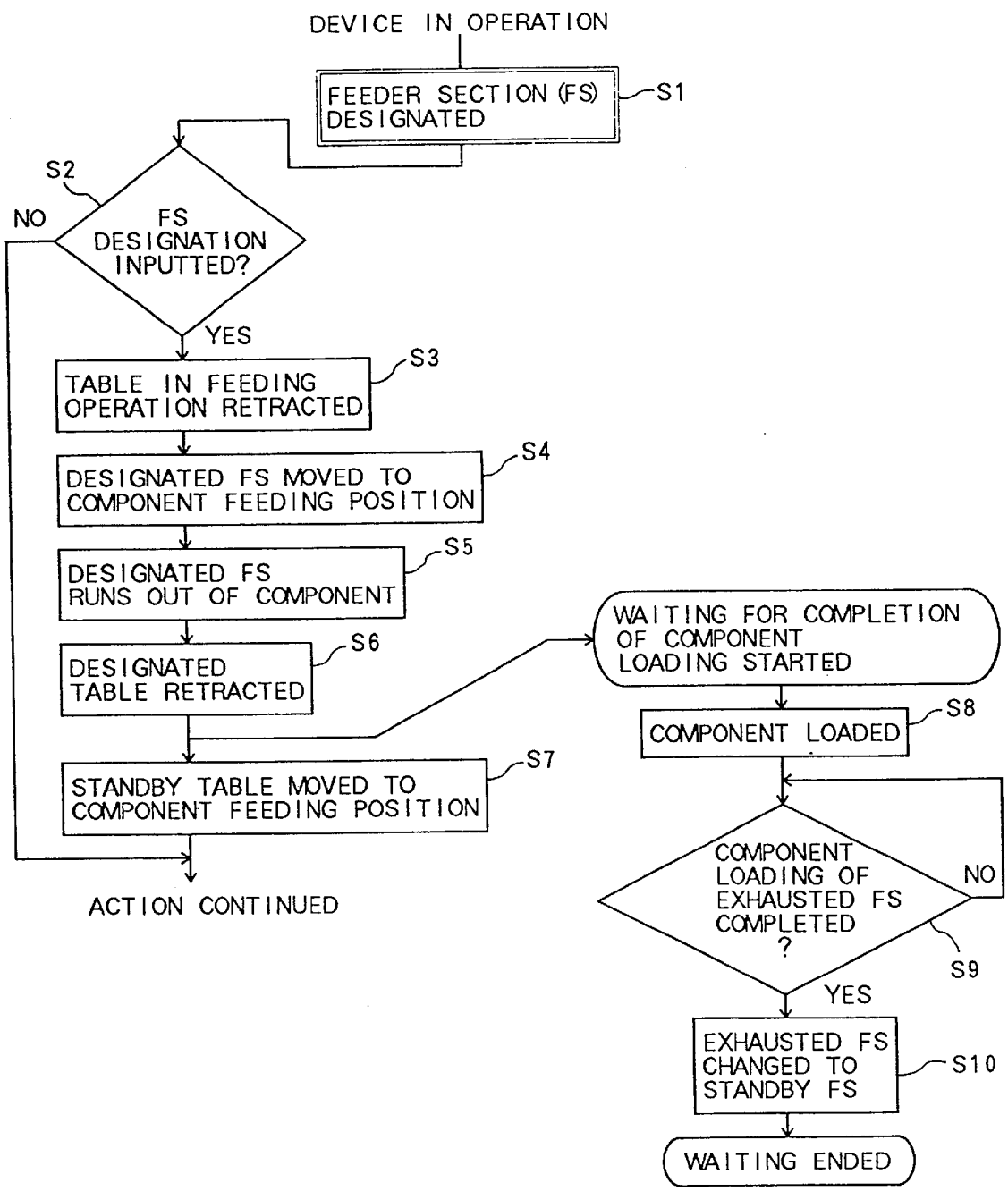
FIG. 2 is a schematic flow chart of a method of feeding an electronic component according to the first embodiment of the present invention.

Referring to FIGS. 1 and 2, a given component supply unit of the selected moving table 21 is positioned at the component feeding position 23 by means of the feeder section controller 29. The suction nozzle 24 is lowered at the component pick-up position 23, picks up an electronic component by suction, and goes upwards. The suction nozzle 24 holding the electronic component is then moved in the direction of the arrow A in accordance with the movement of the rotary table 25, and is lowered at the mounting position 31. Meanwhile, the X-Y table 26 positions a desired location of the circuit substrate 27 at the mounting position 31.

Figure 5:
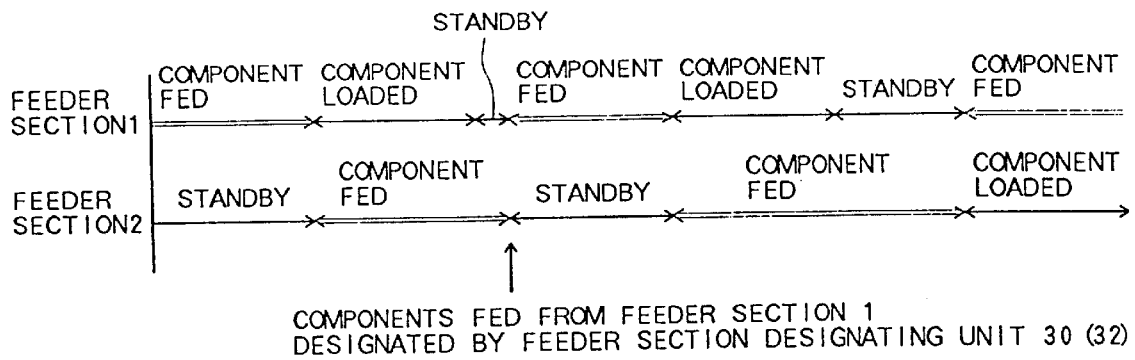
FIG. 5 is a diagram for explaining actions of the electronic component feeding device according to the first and second embodiments of the present invention.
Figure 6:
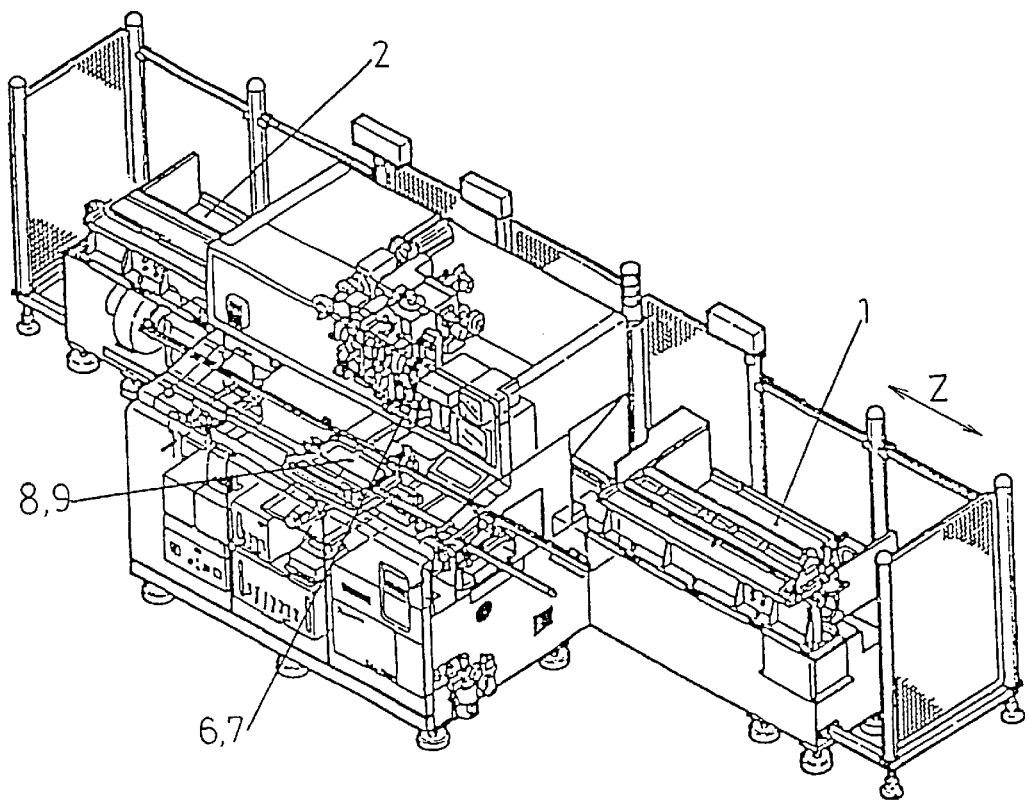
FIG. 6 is a perspective view showing the overall construction of the electronic component mounting device.
Figure 7A:
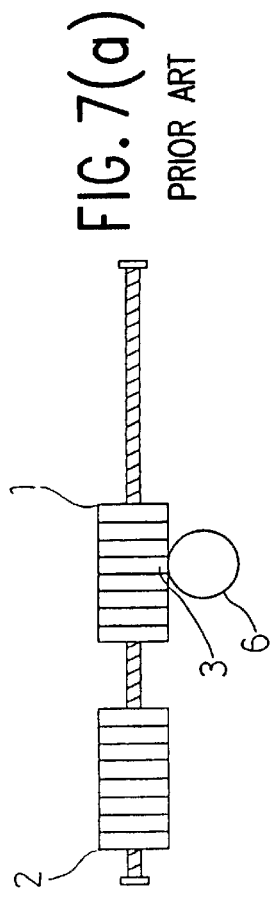
FIGS. 7(a), 7(b) and 7(c) are a typical plan views of a conventional electronic component feeding device.
Figure 7B:
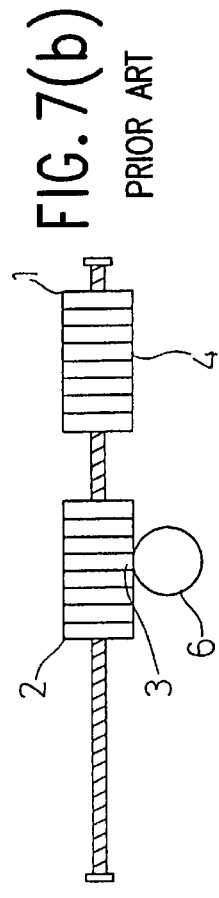
Figure 7C:
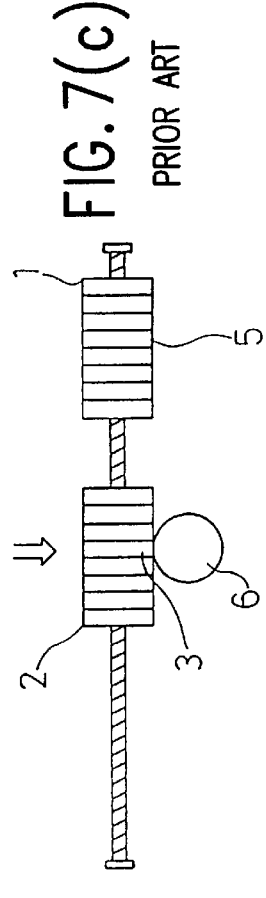
Figure 8:
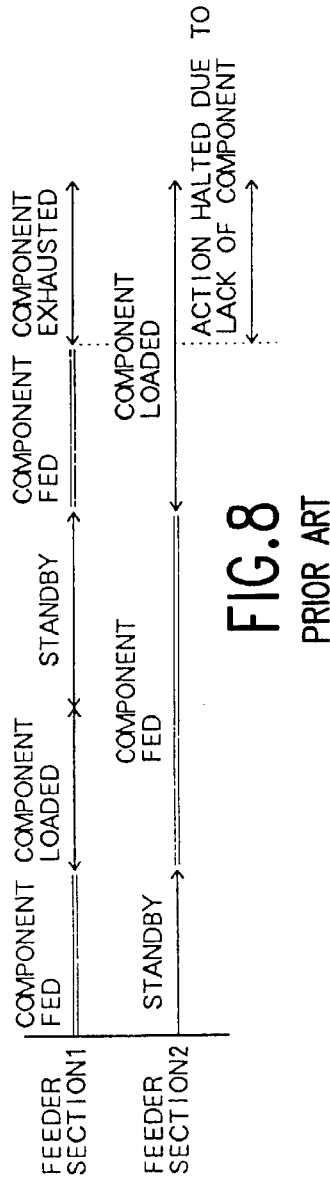
FIG. 8 is a diagram for explaining actions of the conventional electronic component feeding device.

The above series of actions are illustrated by a time chart in FIG. 5. Supposing that the feeder section 1 is now feeding electronic components, while the other feeder section 2 is in a standby state, when the feeder section 1 runs out of the components, the feeder section 2 starts component feeding. Meanwhile, the feeder section 1 is loaded with the electronic components so as to be in a standby state.

At this time, in this embodiment, if any of the component supply units 22 on the moving table 20 of the feeder section 1 have only few remaining electronic components, the moving table 20 is designated by an operator through the feeder section designating unit 30 (step S1 in FIG. 2).

Since the feeder section is normally disposed at a position such that the operator can approach thereto and visually recognize it, the state of the feeder section 1 on standby is checked regularly or irregularly by the operator, and the feeder section 1 is selected by, for example, operating a selecting switch as necessary, thereby designating the moving table 20 as described above.

The feeder section controller 29, upon the feeder section designation being inputted, sends a driving command to the driving means so as to move the moving table 21 which is now feeding components to a specific retracted position so that the feeder section 2 is moved aside (steps S2 to S3 in FIG. 2). In the case where the feeder section designation has not been inputted, the feeder section controller 29 allows the moving table 21 to continue its feeding action. The prescribed retracted position is normally provided at both ends of the rail. However, according to the situation of installation space for the device, the tables may be moved aside in a direction perpendicular to the direction denoted at Z in the figure. In short, the retracted position may be set anywhere which is out of the area of component feeding operation.

When the moving table 21 is moved to the retracted position, the moving table 20 of the feeder section 1 which has been designated is positioned to the component feeding position 23, where components are fed from the feeder section 1 (step S4 in FIG. 2).

The feeder section 1 will be soon in the component exhausted state (where the number of remaining electronic components of one type loaded on the component supply unit on the moving table 20 has become zero), after which the feeder section controller 29 causes the moving table 20 to move to the retracted position, and brings the moving table 21 of the feeder section 2 back to the component feeding position 23 (steps S5, S6, and S7 in FIG. 2).

The moving table 20 which has been moved to the retracted position 20 comes then to be in the "component loading completion waiting state".

In other words, the feeder section 1 is loaded with electronic components, and since this time there is ample time for this operation, the feeder section 1 will soon be placed into the standby state after the completion of loading of the electronic components (steps S8, S9, and S10 in FIG. 2).

Accordingly, in this first embodiment, it is prevented that both of the feeder sections 1, 2 run out of components, and a long-time pause of the electronic component mounting device due to lack of components is eliminated. By this, the operation rate of the electronic component mounting device can be enhanced.

Figure 3:
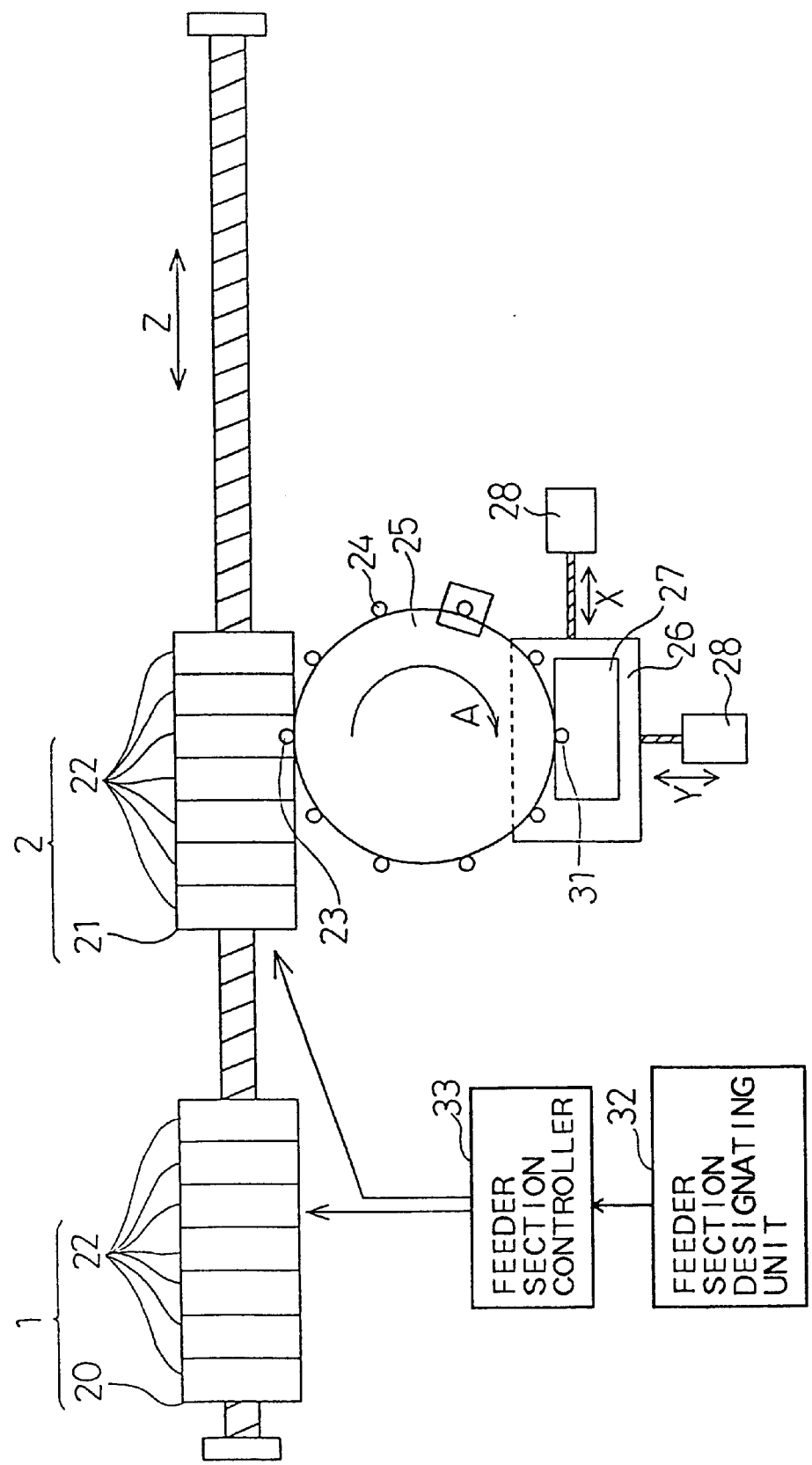
FIG. 3 is a typical plan view of an electronic component feeding device according to a second embodiment of the present invention.

In FIG. 3, each of the constituting elements indicated by the reference numerals 20–28 and 31 are substantially the same as those of the first embodiment, and the explanations thereof will be omitted. In the component feeding device of this second embodiment, a component counter (not shown) in the feeder section designating unit (second feeder section designating means) 32 counts the number of remaining electronic components loaded in all of the component supply units on the moving table. This embodiment is different from the first embodiment in that, in case any of these counted numbers is less than a predetermined value, the moving table is able to be designated. It is not always necessary to count the number of components with respect to the component supply units on the moving table which is now feeding components, but here in this embodiment, in order to simplify the control of the device, the numbers of components of all the component supply units are counted. When there are no such restrictions in respect of control, it will suffice if the number of components in the component supply units of at least the moving table which is in the standby state is counted.

Following this, the feeder section controller (second feeder section controlling means) 33 controls positioning of the moving tables 20, 21, such as to position the component supply unit of selected one of the feeder sections to the component feeding position 23. When the feeder section which has been selected runs out of the components, it is retracted, and the other feeder section which is on standby is selected and positioned at the component feeding position 23 for further component feeding. When the feeder section designating unit 32 has designated one of the moving tables, this designated moving table is selected and positioned at the component feeding position 23 for further component feeding. This also differs from the first embodiment.

The feeder section controller 33 may be exemplified by an executing program constructed in a computer. The feeder section designating unit 32 may be, for example, embodied by properly combining a component counter for counting the remainder number of electronic components, a setting device for preliminarily setting prescribed setting values, and a comparator for comparing the counted numbers and the setting values. However, it is not essential to construct all of the elements in the feeder section designating unit 32 with hardware, and a part of them may be embodied by the above mentioned executing program constructed in the computer.

Actions with the above described construction will be described below.

Figure 4:
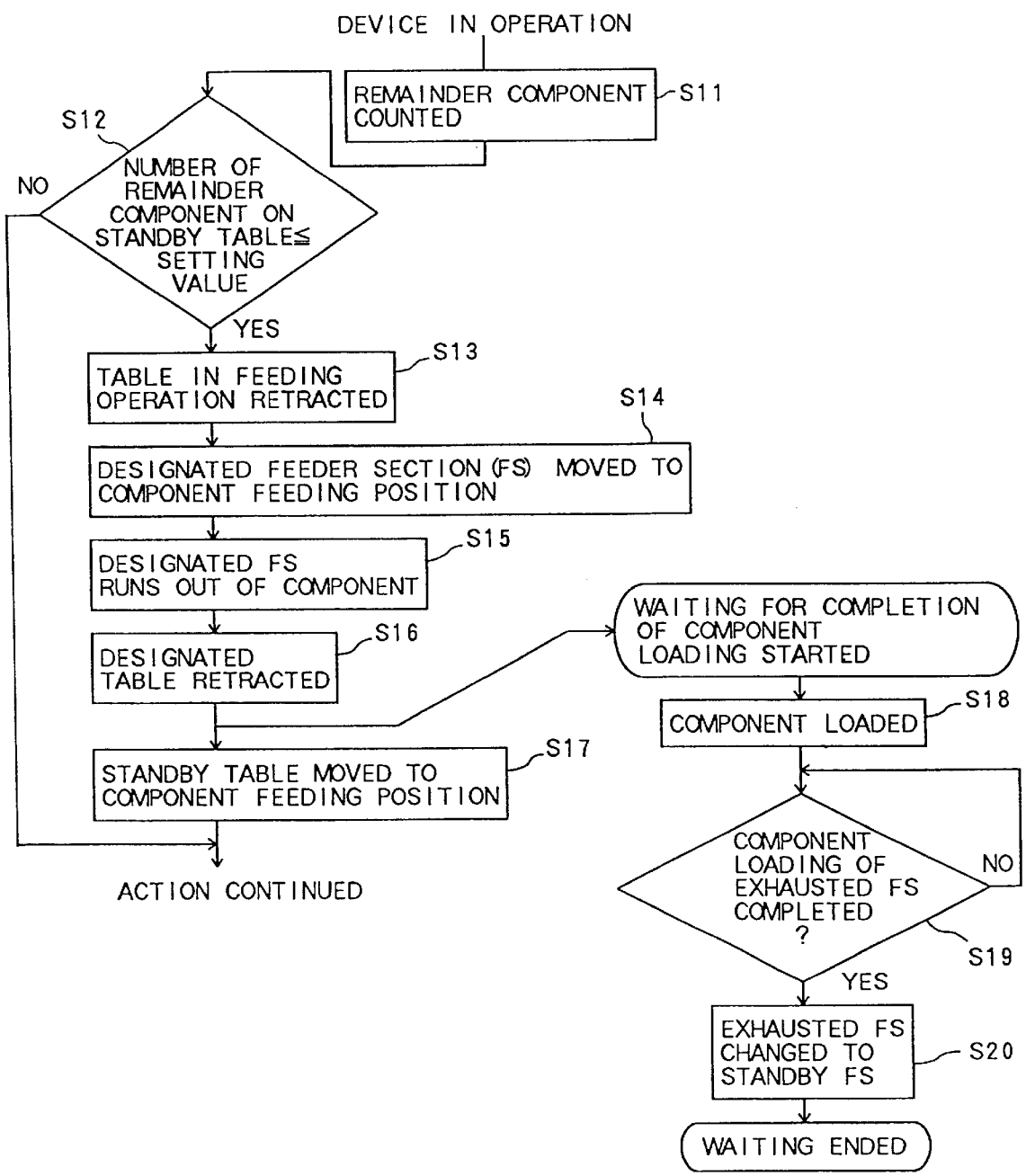
FIG. 4 is a schematic flow chart of a method of feeding an electronic component according to the second embodiment of the present invention.

Referring to FIGS. 3 and 4, a given component supply unit of the selected moving table 21 is positioned to the component feeding position 23 by the feeder section controller 33. The suction nozzle 24 is lowered at the component pick-up position 23, picks up an electronic component by suction, and goes upwards. The suction nozzle 24 holding the electronic component is then moved in the direction of the arrow A in accordance with the movement of the rotary table 25, and is lowered at the mounting position 31. Meanwhile, the X-Y table 26 positions a desired location of the circuit substrate 27 at the mounting position 31.

The above series of actions can be also expressed by the time chart of FIG. 5. Supposing that the feeder section 1 is now feeding electronic components, while the other feeder section 2 is in a standby state, when the feeder section 1 runs out of the components, the feeder section 2 starts component feeding.

Meanwhile, the feeder section 1 is loaded with the electronic components so as to be in a standby state.

At this time, in this second embodiment, the remainder numbers of electronic components loaded in each of the component supply units 22 are counted by the component counter in the feeder section designating unit 32, and if there are any component supply units 22 on the moving table 20 of the feeder section 1 in which electronic components are left only in a small amount, the moving table 20 is automatically designated by the feeder section designating unit 32 (step S1 in FIG. 4). In other words, the factors which are subjected to the operator's decisions in the first embodiment are eliminated in this embodiment, so as to eliminate any error by the operator as well as to reduce the burden on the operator.

The feeder section controller 33, upon the feeder section designation being inputted, sends a driving command to the driving means so as to move the moving table 21 which is now feeding components to the retracted position so that the feeder section 2 is moved aside (steps S12 to S13 in FIG. 4). When the feeder section designation has not been inputted, the feeder section controller 33 allows the moving table 21 to continue its feeding action.

When the moving table 21 is moved to the retracted position, the moving table 20 of the feeder section 1 which has been designated is positioned at the component feeding position 23, where components are fed from the feeder section 1 (step S14 in FIG. 4).

After the feeder section 1 has come to be in the component exhausted state (where the number of remaining electronic components of one type loaded on the moving table 20 has become zero) in a short time, the feeder section controller 33 causes the moving table 20 to move to the retracted position, and brings the moving table 21 of the feeder section 2 back to the component feeding position 23 (steps S15, S16, and S17 in FIG. 4).

The moving table 20 which has been moved to the retracted position comes to be in the "component loading completion waiting state".

In other words, the feeder section 1 is loaded with electronic components, and since there is ample time for this operation, the feeder section 1 will soon become the standby state after the completion of loading of the electronic components (steps S18, S19, and S20 in FIG. 4).

Accordingly, in this second embodiment, it is prevented that both of the feeder sections 1, 2 run out of components, and together with the fact that there are no arbitrary factors such as operator's decisions unlike in the first embodiment, an extensive shutdown of the electronic component mounting device due to shortage of components is surely eliminated. By this, the operation rate of the electronic component mounting device can be enhanced.

Although the examples have been given where two feeder sections are provided in the above first and second embodiments, the present invention can be applied to an electronic component feeding device with and feeder sections. Furthermore, the present invention may be applied with the above described first and second embodiments combined together.

As can be seen from the above description, the present invention is useful as a method and apparatus for feeding components in an electronic component mounting device, since an extensive shutdown of the device due to lack of components is prevented by effectively utilizing a plurality of feeder sections.

What is claimed is:

1. A method of feeding an electronic component wherein if one of a plurality of feeder sections, which are loaded with electronic components, runs out of at least one type of electronic components during a component feeding operation, another one of the feeder sections which has been in a standby state starts feeding the electronic components of the type which has been used up, the method comprising:

designating one of the feeder sections in the standby state for insertion into the component feeding operation when a number of components remain in said one of the feeder sections and the number is below a given amount;

moving the feeder section which is currently feeding electronic components aside to a retracted position when the feeder section in the standby state is designated; and moving the designated feeder section to a predetermined component feeding position.

2. The method according to claim 1, further comprising:

retracting the designated feeder section when it runs out of at least one type of electronic components;

then loading the designated feeder section with electronic components; and then placing the designated feeder section loaded with electronic components into the standby state.

3. A device for feeding an electronic component wherein if one of a plurality of feeder sections, which are loaded with electronic components, runs out of at least one type of electronic components during a component feeding operation, another one of the feeder sections which has been in a standby state starts feeding the electronic components of the type which has been used up the device comprising:

feeder section designating means for counting the electronic components in each of the feeder sections which are in a standby state, and for designating any feeder section which has less electronic components than a predetermined value, and feeder section controlling means coupled to said feeder section designating means for moving the feeder section which is currently feeding electronic components to a retracted position when another feeder section has been designated by said feeder section designating means, and for moving the designated feeder section which as been in a standby state to a predetermined component feeding position.

4. The device according to claim 3, wherein each of the feeder sections includes a movable table and a plurality of component supply units.

5. The device according to claim 3, wherein said feeder section designating means comprise:

a component counter for counting electronic components;

a setting device for enabling the predetermined value to be set; and a comparator for comparing the amount of electronic components counted by said component counter to the predetermined value set by said setting device.

6. A device for feeding an electronic component wherein if one of a plurality of feeder sections, which are loaded with electronic components, runs out of at least one type of electronic components during a component feeding operation, another one of the feeder sections which has been in a standby state starts feeding the electronic components of the type which has been used up the device comprising:

first feeder section designating means for enabling the designation of a desired one of the feeder sections which are in a standby state for insertion into the component feeding operation when a number of components remain in said one of the feeder sections and the number is below a given amount; and feeder section controlling means coupled to said first feeder section designating means for moving the feeder section which is currently feeding electronic components to a retracted position when another feeder section has been designated by said first feeder section designating means, and for moving the designated feeder section which has been in a standby state to a predetermined component feeding position.

7. The device according to claim 6, wherein said first feeder section designating means comprise a selecting switch.

8. The device according to claim 6, wherein each of the feeder sections includes a movable table and a plurality of component supply units.

9. The device according to claim 6, wherein said feeder section controlling means are structured and arranged such that when one of the feeder sections has not been designated by said first feeder section designating means, the feeder section which is currently feeding electronic components continues to feed electronic components and is not moved to the retracted position.

10. A device for feeding an electronic component wherein if one of a plurality of feeder sections, which are loaded with electronic components, runs out of at least one type of electronic components during a component feeding operation, another one of the feeder sections which has been in a standby state starts feeding the electronic components of the type which has been used up the device comprising:

first feeder section designating means for enabling the designation of a desired one of the feeder sections which are in a standby state for insertion into the component feeding operation;

feeder section controlling means coupled to said first feeder section designating means for moving the feeder section which is currently feeding electronic components to a retracted position when another feeder section has been designated by said first feeder section designating means, and for moving the designated feeder section which has been in a standby state to a predetermined component feeding position;

second feeder section designating means for counting the electronic components in each of the feeder sections which are in a standby state, and for designating any feeder section which has less electronic components than a predetermined value; and said feeder section controlling means being coupled to said second feeder section designating means and being arranged to move the feeder section which is currently feeding electronic components to a retracted position when another feeder section has been designated by said first feeder section designating means or said second feeder section designating means and to move the designated feeder section which has been in a standby state to a predetermined component feeding position.

11. The device according to claim 10, wherein said second feeder section designating means comprise:

a component counter for counting electronic components;

a setting device for enabling the predetermined value to be set; and a comparator for comparing the amount of electronic components counted by said component counter to the predetermined value set by said setting device.

12. A method of feeding an electronic component wherein if one of a plurality of feeder sections, which are loaded with electronic components, runs out of at least one type of electronic components during a component feeding operation, another one of the feeder sections which has been in a standby state starts feeding the electronic components of the type which has been used up, the method comprising:

counting the electronic components in each of the feeder sections which are in a standby state;

determining whether any feeder section in the standby state has a number of components which is less than a predetermined value, and if so, designating this feeder sections;

moving the feeder section which is currently feeding electronic components aside to a retracted position once one of the feeder sections has been designated; and moving the designated feeder section to a predetermined component feeding position.

13. The method according to claim 12, further comprising:

retracting the designated feeder section when it rum out of at least one type of electronic components;

then loading the designated feeder section with electronic components; and then placing the designated feeder section loaded with electronic components into the standby state.

14. A method of feeding an electronic component wherein if one of a plurality of feeder sections, which are loaded with electronic components, runs out of at least one type of electronic components during a component feeding operation, another one of the feeder sections which has been in a standby state starts feeding the electronic components of the type which has been used up, the method comprising:

visually observing the number of electronic components remaining in supply units of the feeder sections in the standby state;

designating one of the feeder sections in the standby state entailing designating one of the feeder sections in the standby state having only a few remaining electronic components in any of the supply units of the feeder section as visually observed;

moving the feeder section which is currently feeding electronic components aside to a retracted position when the feeder section in the standby state is designated; and moving the designated feeder section to a predetermined component feeding position.

* * * * *